United States Patent
Kawa et al.

(10) Patent No.: US 6,369,619 B1
(45) Date of Patent: Apr. 9, 2002

(54) VOLTAGE TOLERANT INPUT/OUTPUT CIRCUIT

(75) Inventors: Jamil Kawa, Santa Clara; Rahul Nimaiyar, Cupertino; Puneet Sawhney, San Jose; Anwar Awad, Sunnyvale, all of CA (US)

(73) Assignee: Artisan Components, Inc., Sunnyvale, CA (US)

(*) Notice: Subject to any disclaimer, the term of this patent is extended or adjusted under 35 U.S.C. 154(b) by 0 days.

(21) Appl. No.: 09/615,959

(22) Filed: Jul. 14, 2000

Related U.S. Application Data

(60) Provisional application No. 60/207,527, filed on May 26, 2000.

(51) Int. Cl.[7] .............................. G05F 1/10; G05F 3/02; H03B 1/00
(52) U.S. Cl. ........................................ 327/108; 327/535
(58) Field of Search ............................... 327/108, 112, 327/185, 534, 535, 537, 538, 541, 543, 545; 326/83, 81; 365/185.01, 185.18

(56) References Cited

U.S. PATENT DOCUMENTS

| | | | |
|---|---|---|---|
| 5,160,855 A | 11/1992 | Dobberpuhl | 307/270 |
| 5,451,889 A | 9/1995 | Heim et al. | 326/81 |
| 5,455,732 A | 10/1995 | Davis | 361/90 |
| 5,543,733 A | 8/1996 | Mattos et al. | 326/81 |
| 5,646,809 A * | 7/1997 | Motley et al. | 361/56 |
| 5,907,249 A * | 5/1999 | Hsia et al. | 326/81 |
| 5,973,511 A * | 10/1999 | Hsia et al. | 326/81 |
| 6,147,511 A * | 11/2000 | Patel et al. | 326/81 |
| 6,208,167 B1 * | 3/2001 | Ranjan et al. | 326/81 |

FOREIGN PATENT DOCUMENTS

EP        0 722 223 A        7/1996

\* cited by examiner

*Primary Examiner*—My-Trang Nu Ton
(74) *Attorney, Agent, or Firm*—Martine & Penilla, LLP

(57) ABSTRACT

The present invention provides a voltage tolerant input/output circuit configured to ensure proper interface tolerance between various close voltages in deep sub-micron circuits without any DC leakage. The voltage tolerant input/output circuit includes (1) an arbiter circuit logically configured to ensure that a gate of a P-driver of the voltage tolerant input/output circuit is biased at the higher of an input/output voltage and an input/output supply voltage when the P-driver is tri-stated, (2) a bias circuit logically configured to biased a floating N-well of the P-driver to ensure that no parasitic diodes formed between any source or drain of a p-device of the voltage tolerant input/output circuit and the N-well of the P-driver is forward biased, and (3) a driver circuit comprising the P-driver.

17 Claims, 5 Drawing Sheets

VOLTAGE TOLERANT INPUT/OUTPUT CIRCUIT

RELATED APPLICATIONS

This application is related to U.S. Provisional Patent Application No. 60/207527, filed May 26, 2000. The contents of U.S. Provisional Patent Application No. (Not yet assigned), filed May 26, 2000, are hereby incorporated by reference.

FIELD OF THE INVENTION

The present invention relates to electronic circuits, and particularly relates to a voltage tolerant input/output circuit configured to ensure proper interface tolerance between various close voltages in deep sub-micron circuits without any leakage.

BACKGROUND OF THE INVENTION

In older generations of CMOS technologies, the standard value of the supply voltage powering the chip was 5 volts, +/−10%. Under that setting, the standard design of the P-driver of the Input/Output (hereinafter I/O) involved coupling the N-well of the P-driver to VDD permanently in order to permanently ensure that the N-well potential was always higher than any other voltages in the circuit. This design prevented any unwanted DC leakage through the P-driver.

In conventional CMOS integrated circuits, large N-wells are formed on p-type substrates, and PMOS transistors are formed in these N-wells. Typically, all of the P-channel transistors of the P-driver are formed in a common N-well and have substrate or terminals that are electrically integral with or connected to the N-well.

In sub-micron CMOS technologies, VDD supply voltages had to scale down with the sub-micron CMOS technologies. A VDD supply voltage of 3.3 volts became standard for I/O power. This created the problem of interfacing 3.3 volt I/Os to 5 volt supplied I/Os. The problem materialized when the P-driver was tri-stated.

The P-driver is tri-stated when it is in a "tri-state" or "high impedance" mode. Tristate mode occurs when the low voltage CMOS core logic circuitry associated with the tristate P-driver is not driving a bus connected to the P-driver. Instead, the low-voltage CMOS core logic circuitry is either (1) receiving data from the bus at node VPAD or (2) is not involved in any transactions occurring on the bus. In this circumstance, it is desired for the P-driver to have a high input impedance for avoiding unnecessary current sinks and for reducing overall bus inductance and capacitance.

Standard circuitry, as shown in FIG. 1, addressed this problem by doing the following:

(1) floating the N-well of the P-driver; and
(2) pulling the gate of the tri-stated P-driver to PAD voltage when the PAD voltage was 5 volts.

This standard solution worked well since the difference between 5 volts, +/−10%, and 3.3 volts, +/−10%, always exceeded Vtp, the forward conducting voltage of the P-driver, and, also equivalent to one diode drop.

In deep sub-micron CMOS technologies, VDD supply voltages continued to scale down, sometimes below the VDD supply voltages of the sub-micron CMOS technologies. VDD supply voltages of 2.5 volts and 1.8 volts became common. These low VDD supply voltages made the interface issue (the tolerance issue) between such VDD supply voltages more complicated.

The standard sub-micron circuit technique described above for having a 3.3 volt I/O tolerate a 5 volt I/O fails when the new values for the I/O VDD supply voltages and the tolerated input voltages are 2.5 volts, +/−10%, and 3.3 volts, +/−10%, respectively. This is because for a VDD of 2.75 volts (2.5 volts +10%) and a tolerated voltage of 3 volts (3.3 volts −10%), the voltage difference between VDD and the tolerated voltage is less than Vtp. This results in excessive and unacceptable DC leakage through the P-driver.

Therefore, a voltage tolerant input/output circuit configured to ensure proper interface tolerance between various close voltages in deep sub-micron circuits without any DC leakage is needed.

SUMMARY OF THE INVENTION

The present invention provides a voltage tolerant input/output circuit configured to ensure proper interface tolerance between various close voltages in deep sub-micron circuits without any DC leakage.

The voltage tolerant input/output circuit includes (1) an arbiter circuit logically configured to ensure that a gate of a P-driver of the voltage tolerant input/output circuit is biased at the higher of an input/output voltage and an input/output supply voltage when the P-driver is tri-stated, (2) a bias circuit logically configured to biased a floating N-well of the P-driver to ensure that no parasitic diodes formed between any source or drain of a p-device of the voltage tolerant input/output circuit and the N-well of the P-driver is forward biased, and (3) a driver circuit comprising the P-driver.

THE FIGURES

DETAILED DESCRIPTION OF THE INVENTION

Figure 1:
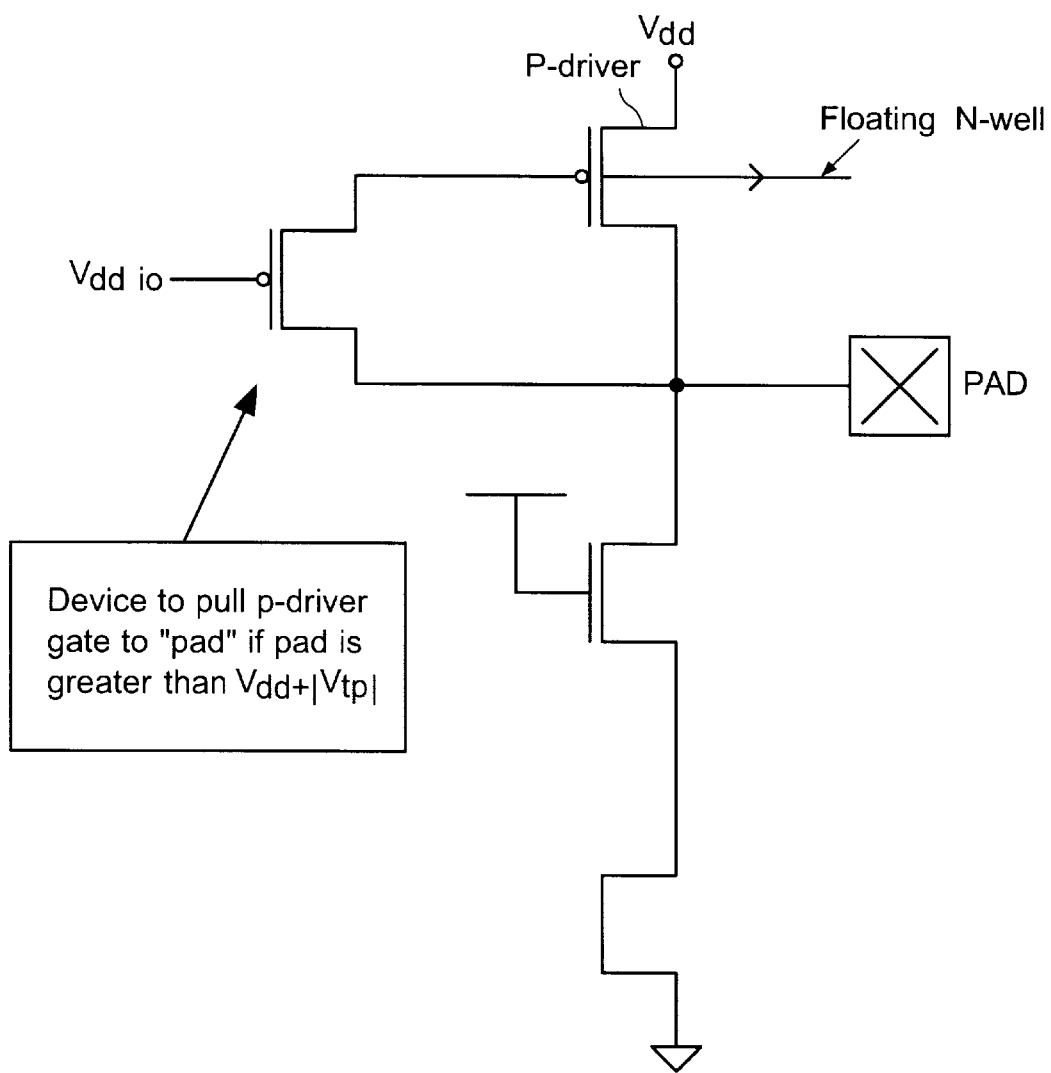
FIG. 1 is a circuit diagram of a prior art voltage tolerant circuit for sub-micron CMOS technologies.
Figure 2:
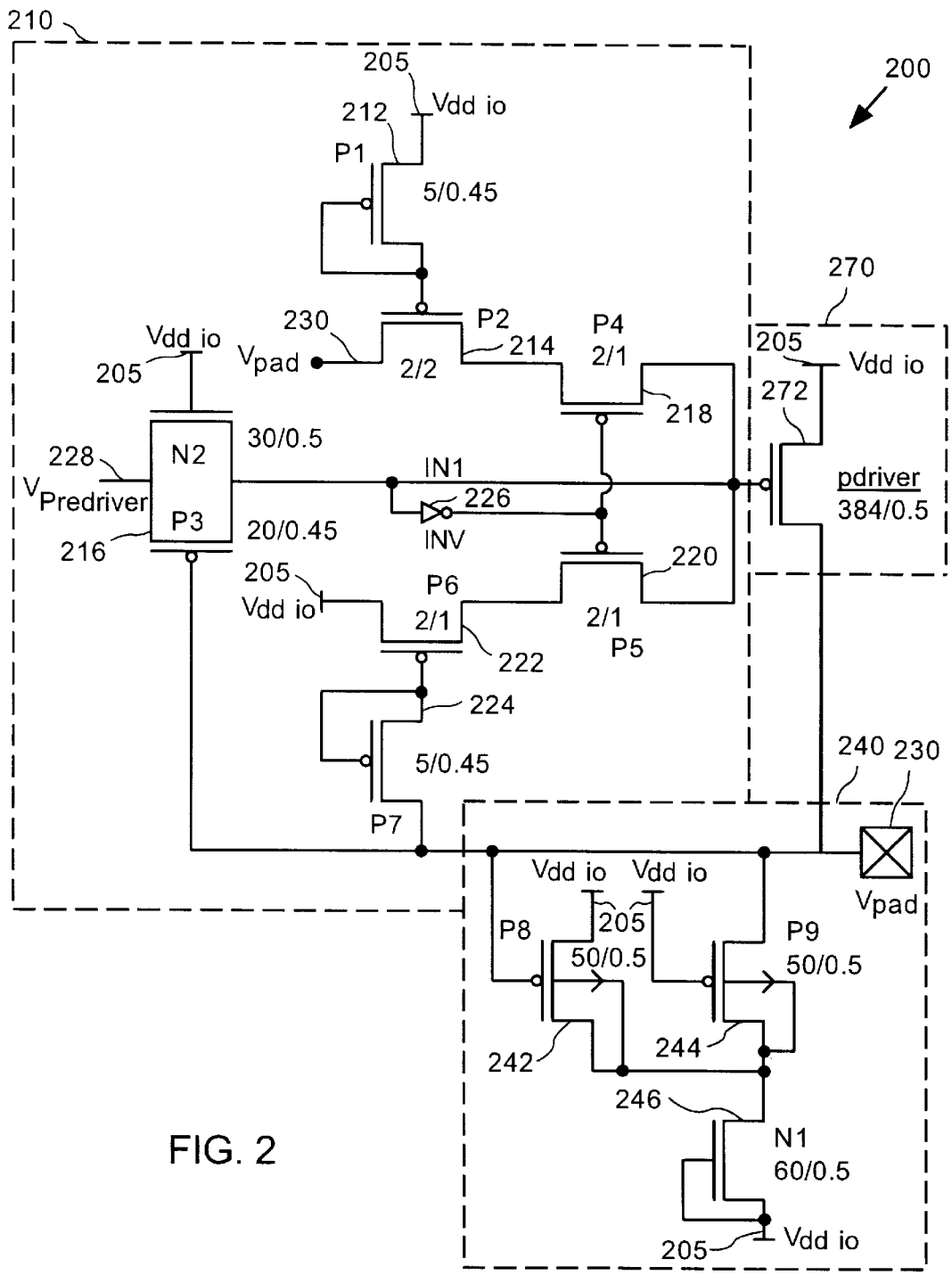
FIG. 2 is a circuit diagram of a voltage tolerant input/output circuit in accordance with an exemplary embodiment of the present invention.

Referring to FIG. 2, a voltage tolerant input/output circuit 200 in accordance with an exemplary embodiment of the present invention is shown.

In an exemplary embodiment, voltage tolerant I/O circuit 200 is implemented with an all PMOS substrate logically coupled to a N-well.

Configuration of the Voltage Tolerant Input/Output Circuit

In an exemplary embodiment, the voltage tolerant input/output circuit 200 includes the following components logically interconnected as shown in FIG. 2:

(1) an arbiter circuit 210;
(2) a bias circuit 240; and
(3) a driver circuit 270.

In an exemplary embodiment, arbiter circuit 210 includes the following components logically interconnected as shown in FIG. 2:

(1) a first transistor 212 (e.g. P1);
(2) a second transistor 214 (e.g. P2);
(3) a pass gate 216 (e.g. N2, P3);
(4) a third transistor 218 (e.g. P4);
(5) a fourth transistor 220 (e.g. P5);
(6) a fifth transistor 222 (e.g. P6);
(7) a sixth transistor 224 (e.g. P7);
(8) an inverter 226 (e.g. IN1);
(9) a predriver input 228;
(10) a PAD input 230; and
(11) a Vddio terminal 205.

In an exemplary embodiment, transistors 212 and 222 and pass gate 216 are logically coupled to an I/O supply voltage Vddio via Vddio terminal 205 as shown in FIG. 2. In an exemplary embodiment, pass gate 216 is logically coupled to a predriver voltage Vpredriver via predriver input 228 as shown in FIG. 2. In an exemplary embodiment, transistor 214 is logically coupled to a PAD voltage, VPAD, via PAD input 230 as shown in FIG. 2.

In an exemplary embodiment, bias circuit 240 includes the following components logically interconnected as shown in FIG. 2:

(1) a seventh transistor 242 (e.g. P8);
(2) an eight transistor 244 (e.g. P9);
(3) a ninth transistor 246 (e.g. N1); and
(4) Vddio terminal 205.

In an exemplary embodiment, transistors 242, 244, AND 246, are logically coupled to I/O supply voltage Vddio via Vddio terminal 205 as shown in FIG. 2. In an exemplary embodiment, transistors 242 and 244 are logically coupled to PAD voltage, VPAD, via PAD input 230 as shown in FIG. 2.

In an exemplary embodiment, driver circuit 270 includes a tenth transistor 272, also known as a P-driver, logically interconnected with arbiter circuit 210 and bias circuit 240 as shown in FIG. 2. In an exemplary embodiment, P-driver 272 is logically coupled to I/O supply voltage Vddio as shown in FIG. 2. In an exemplary embodiment, P-driver 272 is logically coupled to PAD voltage, VPAD, via PAD input 230 as shown in FIG. 2. Also, P-driver 272 is logically coupled to transistors 218 and 220, inverter 226, and pass gate 216 as shown in FIG. 2.

Operation of the Voltage Tolerant Input/Output Circuit

In an exemplary embodiment, voltage tolerant input/output circuit 200, via the logical configuration shown in FIG. 2, ensures proper interface tolerance between various close voltages in deep sub-micron circuits without any DC leakage in an exemplary embodiment of the present invention. Voltage tolerant I/O circuit 200 solves the tolerance problem for any interface situation in deep sub-micron circuits whether the difference in the value of VPAD and Vddio exceeds Vtp or not. Voltage tolerant I/O circuit 200 ensures that there is zero DC leakage across P-driver 272 and ensures that the N-well of P-driver 272 is always biased to the higher of the two voltages, Vddio and VPAD at all times.

Arbiter Circuit

In an exemplary embodiment, arbiter 210, via the logical configuration shown in FIG. 2, ensures that the gate of P-driver 272 is biased at the higher of a VPAD and Vddio at all times when P-driver 272 is tri-stated. By ensuring this biasing, arbiter circuit 210 ensures that there is no DC leakage between VPAD and Vddio, regardless of the difference in magnitude between VPAD and Vddio.

In an exemplary embodiment, via the logical configuration shown in FIG. 2, transistor 212 (e.g. P1) biases the gate of transistor 214 (e.g. P2) to a voltage equaling Vddio−Vtp.

This biasing of transistor 214 ensures that transistor 214 and transistor 218 (e.g. P4) will pass the full magnitude of VPAD to the gate of P-driver 272, and, thus, shuts off any DC leakage path through P-driver 272.

In an exemplary embodiment, via the logical configuration shown in FIG. 2, pass gate 216 (e.g. N2, P3) is biased to ensure that when the gate of P-driver 272 is at VPAD, that is when VPAD is greater than Vddio, there is no DC leakage from VPAD to core circuitry logically coupled to predriver input 228.

In an exemplary embodiment, via the logical configuration shown in FIG. 2, transistor 220 (e.g. P5), transistor 222 (e.g. P6), and transistor 224 (e.g. P7) ensure that during the tri-stating of P-driver 272, the lowest voltage that the gate of P-driver 272 can see is Vddio. The lowest voltage that the gate of P-driver 272 can see being Vddio is needed in either of the following situations:

(1) VPAD is a low voltage level corresponding to a logic LOW value for VPAD; or
(2) VPAD equals Vddio.

Bias Circuit

In an exemplary embodiment, bias circuit 240, via the logical configuration shown in FIG. 2, biases the floating N-well of P-driver 272, and, thus, ensures that no parasitic diodes formed between any source or drain of p-device (e.g. a p-transistor) and the N-well of P-driver 272 is forward biased.

In an exemplary embodiment, via the logical configuration shown in FIG. 2, transistor 246 (e.g. N1) ensures that the N-well of P-driver 272 has a minimum bias of Vddio−Vtn.

Vtn is the forward conducting voltage of transistor 246, and is also equivalent to one diode drop.

In an exemplary embodiment, via the logical configuration shown in FIG. 2, transistor 244 (e.g. P9) pulls the N-well of P-driver 272 to VPAD if VPAD is greater than Vddio.

In an exemplary embodiment, via the logical configuration shown in FIG. 2, transistor 242 (e.g. P8) pulls the N-well of P-driver 272 to Vddio if VPAD is LOW, as in the normal operations of an I/O circuit logically coupled to voltage tolerant input/output circuit 200.

Driver Circuit

In an exemplary embodiment, driver circuit 270, via the logical configuration shown in FIG. 2, operates as P-driver 272.

Generally

Figure 3:
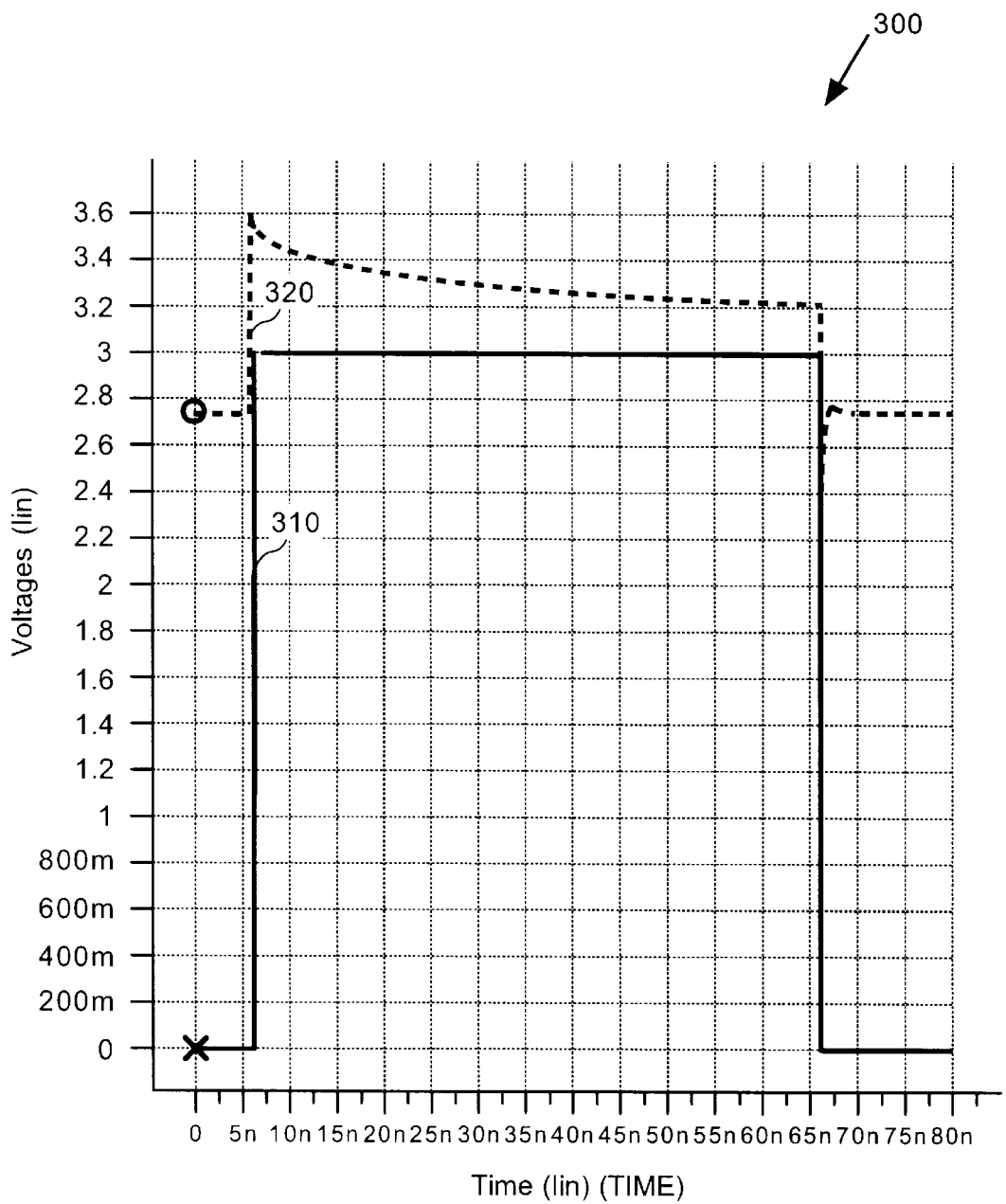
FIG. 3 is a trace diagram of the PAD voltage and the gate voltage of the tri-stated P-driver of the voltage tolerant input/output circuit in accordance with an exemplary embodiment of the present invention.

VPAD and Gate voltage of the Tri-stated P-driver of the Voltage Tolerant Input/Output Circuit Referring to FIG. 3, the PAD voltage, VPAD, and the gate voltage of the tri-stated P-driver of the voltage tolerant input/output circuit in accordance with an exemplary embodiment of the present invention is shown in trace diagram 300. Trace diagram 300 includes trace 310 of VPAD and trace 320 of the voltage at the gate of a tri-stated P-driver 272. Trace 320 shows how the voltage at the gate of tri-stated P-driver 272 varies as VPAD varies from 0 volts to 3 volts, as shown by trace 310. In an exemplary embodiment, Vddio is 2.75 volts. In FIG. 3, the voltage at the gate of P-driver is always high. The voltage at the gate of P-driver 272 being always high blocks any DC leakage from PAD terminal 230 to Vddio terminal 205.

Figure 4:
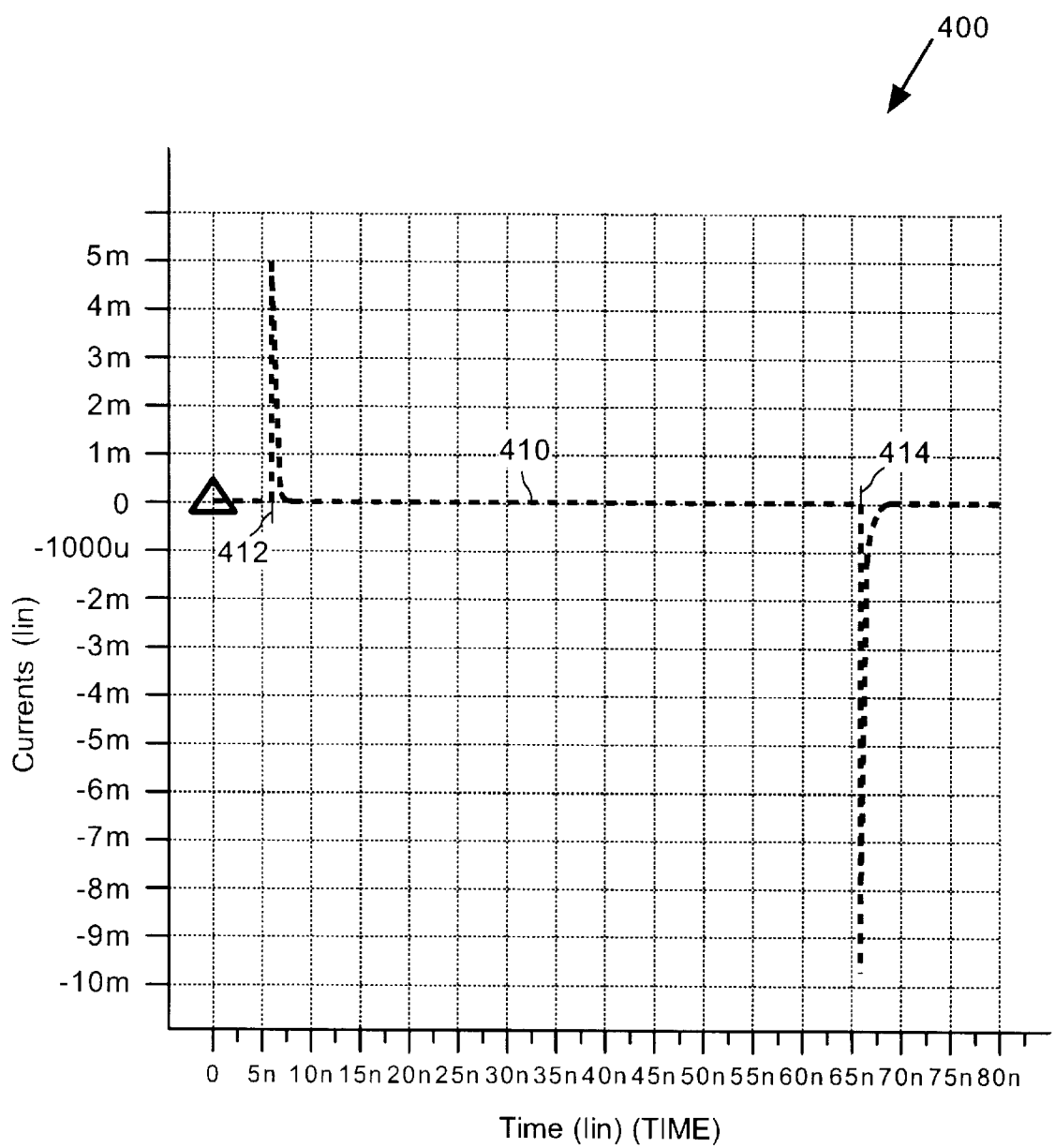
FIG. 4 is a trace diagram of the current through the VDD supply voltage of the I/O of the tri-stated P-driver of the voltage tolerant input/output circuit in accordance with an exemplary embodiment of the present invention.

Referring to FIG. 4, the current through the VDD supply voltage, Vddio, of the I/O of the tri-stated P-driver of the voltage tolerant input/output circuit in accordance with an exemplary embodiment of the present invention is shown in a trace diagram 400. Trace diagram 400 includes trace 410 of the current through Vddio terminal 205. Trace 410 shows a zero leakage current through Vddio terminal 205 at all times except at switching transition times 412 and 414, when switching transients occur.

Figure 5:
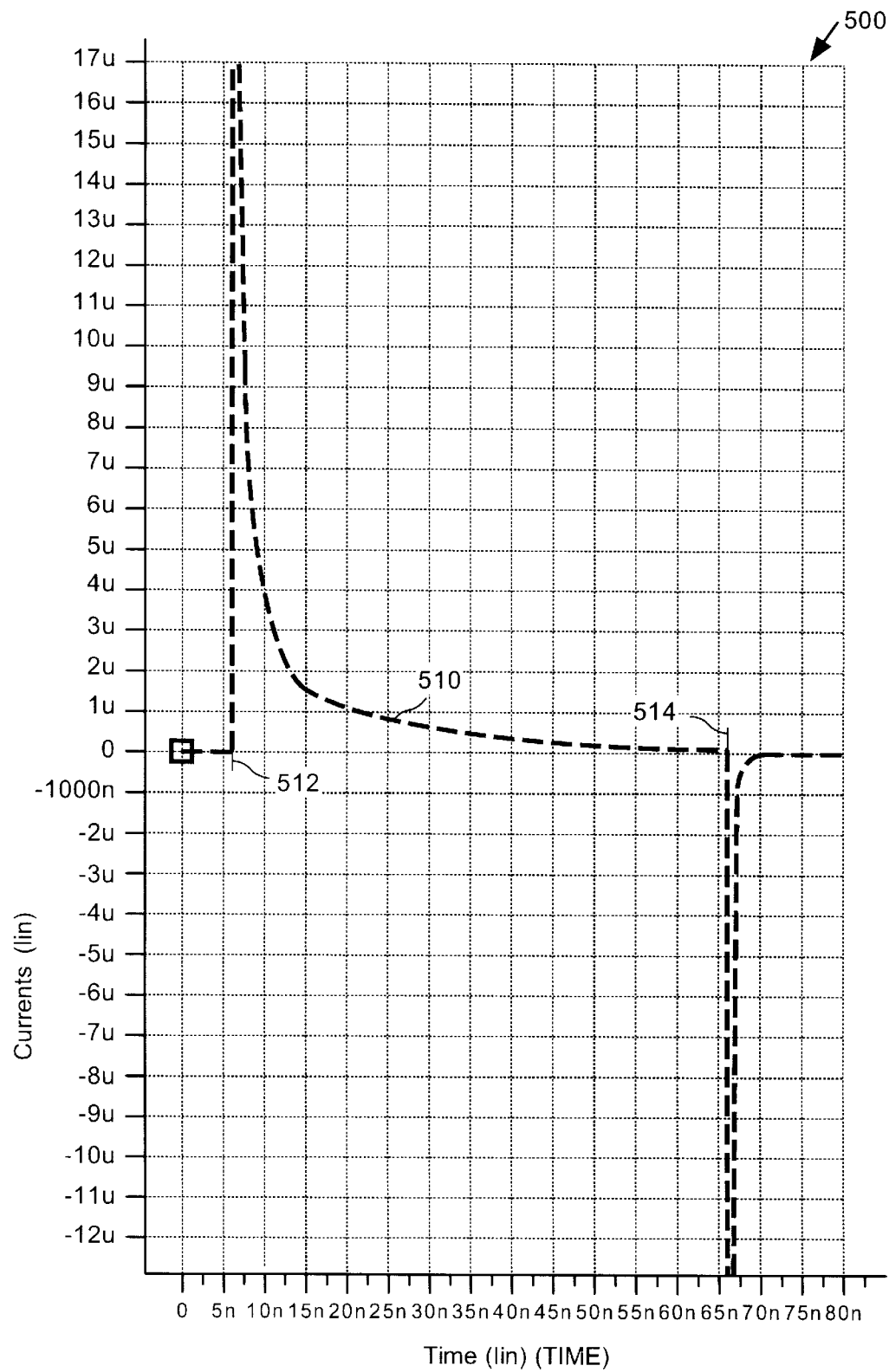
FIG. 5 is a trace diagram of the current through the P-driver of the tri-stated P-driver of the voltage tolerant input/output circuit in accordance with an exemplary embodiment of the present invention.

Referring to FIG. 5, the current (leakage) through P-driver 272 of the tri-stated voltage tolerant input/output circuit in accordance with an exemplary embodiment of the present invention is shown in a trace diagram 500. Trace diagram 500 includes trace 510 of the current (leakage) through P-driver 272. Trace 510 shows that, except for a switching transient current at transition times 512 and 514, the current (leakage current) through P-driver 272 is zero.

Summary

In sum, in an exemplary embodiment, voltage tolerant input/output circuit 200, via the logical configuration of arbiter circuit 210, bias circuit 240, and driver circuit 270, as shown in FIG. 2, ensures proper interface tolerance between various close voltages in deep sub-micron circuits without any DC leakage in an exemplary embodiment of the present invention.

Conclusion

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

We claim:

1. A voltage tolerant input/output circuit configured to ensure proper interface tolerance between various close voltages in deep sub-micron circuits without any DC leakage, comprising:

an arbiter circuit receiving a predriver input through a passgate, the arbiter being configured to ensure that a gate of a P-driver transistor of the voltage tolerant input/output circuit is biased at the higher of an input/output voltage and an input/output supply voltage when the P-driver transistor is tri-stated, the output of the passgate being connected to the gate of the P-driver transistor;

a bias circuit logically configured to bias a floating N-well of the P-driver transistor to ensure that no parasitic diodes formed between any source or drain of a p-device of the voltage tolerant input/output circuit and the N-well of the P-driver transistor is forward biased; and a driver circuit comprising the P-driver transistor, one terminal of the P-driver transistor being coupled to input/output supply voltage and another terminal being coupled to the input/output voltage, and the passgate having a first gate coupled to the input/output voltage, and a second gate coupled concurrently to the bias circuit and the input/output voltage;

wherein the arbiter circuit is logically configured to ensure that there is no DC leakage current between the input/output voltage and the input/output supply voltage, regardless of the difference in magnitude between the input/output voltage and the input/output supply voltage.

2. The circuit of claim 1 wherein the arbiter circuit comprises:

a first transistor of a first type; and a second transistor of the first type, wherein the first transistor of the first type is logically configured to bias the gate of the second transistor of the first type to a voltage equaling the difference between the input/output supply voltage and the forward conducting voltage of the first transistor, and, thus, ensures that the second transistor and a third transistor will pass the full magnitude of the input/output voltage is passed to the gate of the P-driver transistor, and, thus, shuts off any DC leakage path through the P-driver transistor.

3. The circuit of claim 1 wherein the bias circuit is logically configured to ensure that the N-well of the P-driver has a minimum bias equal to the difference between the input/output supply voltage and the forward conducting voltage of a n-type transistor.

4. A voltage tolerant input/output circuit configured to ensure proper interface tolerance between various close voltages in deep sub-micron circuits without any DC leakage, comprising:

an arbiter circuit receiving a predriver input through a passgate, the arbiter being configured to ensure that a gate of a P-driver transistor of the voltage tolerant input/output circuit is biased at the higher of an input/output voltage and an input/output supply voltage when the P-driver transistor is tri-stated, the output of the passgate being connected to the gate of the P-driver transistor;

a bias circuit logically configured to bias a floating N-well of the P-driver transistor to ensure that no parasitic diodes formed between any source or drain of a p-device of the voltage tolerant input/output circuit and the N-well of the P-driver transistor is forward biased; and a driver circuit comprising the P-driver transistor, one terminal of the P-driver transistor being coupled to input/output supply voltage and another terminal being coupled to the input/output voltage, and the passgate having a first gate coupled to the input/output voltage, and a second gate coupled concurrently to the bias circuit and the input/output voltage;

wherein the arbiter circuit comprises, a first transistor of a first type, and a second transistor of the first type, wherein the first transistor of the first type is logically configured to bias the gate of the second transistor of the first type to a voltage equaling the difference between the input/output supply voltage and the forward conducting voltage of the first transistor, and, thus, ensures that the second transistor and a third transistor will pass the full magnitude of the input/output voltage is passed to the gate of the P-driver transistor, and, thus, shuts off any DC leakage path through the P-driver transistor.

5. A voltage tolerant input/output circuit as recited in claim 4, wherein the arbiter circuit is logically configured to ensure that there is no DC leakage current between the input/output voltage and the input/output supply voltage, regardless of the difference in magnitude between the input/output voltage and the input/output supply voltage.

6. A voltage tolerant input/output circuit as recited in claim 4, wherein the bias circuit is logically configured to ensure that the N-well of the P-driver transistor has a minimum bias equal to the difference between the input/output supply voltage and the forward conducting voltage of a n-type transistor.

7. A voltage tolerant input/output circuit as recited in claim 4, wherein the arbiter circuit is logically configured to ensure that a lowest voltage that the P-driver transistor can perceive during tri-state is the input/output supply voltage.

8. A voltage tolerant input/output circuit as recited in claim 4, wherein the voltage at a gate of the P-driver transistor is always high which blocks any DC leakage from an input/output voltage terminal to an input/output supply voltage terminal.

9. A voltage tolerant input/output circuit configured to ensure proper interface tolerance between various close voltages in deep sub-micron circuits without any DC leakage, comprising:

an arbiter circuit receiving a predriver input through a passgate, the arbiter being configured to ensure that a gate of a P-driver transistor of the voltage tolerant input/output circuit is biased at the higher of an input/output voltage and an input/output supply voltage when the P-driver transistor is tri-stated, the output of the passgate being connected to the gate of the P-driver transistor;

a bias circuit logically configured to bias a floating N-well of the P-driver transistor to ensure that no parasitic diodes formed between any source or drain of a p-device of the voltage tolerant input/output circuit and the N-well of the P-driver transistor is forward biased; and a driver circuit comprising the P-driver transistor, one terminal of the P-driver transistor being coupled to input/output supply voltage and another terminal being coupled to the input/output voltage, and the passgate having a first gate coupled to the input/output voltage, and a second gate coupled concurrently to the bias circuit and the input/output voltage;

wherein the bias circuit is logically configured to ensure that the N-well of the P-driver transistor has a minimum bias equal to the difference between the input/output supply voltage and the forward conducting voltage of a n-type transistor.

10. A voltage tolerant input/output circuit as recited in claim 9, wherein the arbiter circuit comprises:

a first transistor of a first type; and a second transistor of the first type, wherein the first transistor of the first type is logically configured to bias the gate of the second transistor of the first type to a voltage equaling the difference between the input/output supply voltage and the forward conducting voltage of the first transistor, and, thus, ensures that the second transistor and a third transistor will pass the full magnitude of the input/output voltage is passed to the gate of the P-driver transistor, and, thus, shuts off any DC leakage path through the P-driver transistor.

11. A voltage tolerant input/output circuit as recited in claim 9, wherein the arbiter circuit is logically configured to ensure that there is no DC leakage current between the input/output voltage and the input/output supply voltage, regardless of the difference in magnitude between the input/output voltage and the input/output supply voltage.

12. A voltage tolerant input/output circuit as recited in claim 9, wherein the arbiter circuit is logically configured to ensure that a lowest voltage that the P-driver transistor can perceive during tri-state is the input/output supply voltage.

13. A voltage tolerant input/output circuit as recited in claim 9, wherein the voltage at a gate of the P-driver transistor is always high which blocks any DC leakage from an input/output voltage terminal to an input/output supply voltage terminal.

14. A voltage tolerant input/output circuit configured to ensure proper interface tolerance between various close voltages in deep sub-micron circuits without any DC leakage, comprising:

an arbiter circuit receiving a predriver input through a passgate, the arbiter being configured to ensure that a gate of a P-driver transistor of the voltage tolerant input/output circuit is biased at the higher of an input/output voltage and an input/output supply voltage when the P-driver transistor is tri-stated, the output of the passgate being connected to the gate of the P-driver transistor;

a bias circuit logically configured to bias a floating N-well of the P-driver transistor to ensure that no parasitic diodes formed between any source or drain of a p-device of the voltage tolerant input/output circuit and the N-well of the P-driver transistor is forward biased, the bias circuit being logically configured to ensure that the N-well of the P-driver transistor has a minimum bias equal to the difference between the input/output supply voltage and the forward conducting voltage of a n-type transistor; and a driver circuit comprising the P-driver transistor, one terminal of the P-driver transistor being coupled to input/output supply voltage and another terminal being coupled to the input/output voltage, and the passgate having a first gate coupled to the input/output voltage, and a second gate coupled concurrently to the bias circuit and the input/output voltage;

wherein the arbiter circuit comprises, a first transistor of a first type, and a second transistor of the first type, wherein the first transistor of the first type is logically configured to bias the gate of the second transistor of the first type to a voltage equaling the difference between the input/output supply voltage and the forward conducting voltage of the first transistor, and, thus, ensures that the second transistor and a third transistor will pass the full magnitude of the input/output voltage is passed to the gate of the P-driver transistor, and, thus, shuts off any DC leakage path through the P-driver transistor.

15. A voltage tolerant input/output circuit as recited in claim 14, wherein the arbiter circuit is logically configured to ensure that there is no DC leakage current between the input/output voltage and the input/output supply voltage, regardless of the difference in magnitude between the input/output voltage and the input/output supply voltage.

16. A voltage tolerant input/output circuit as recited in claim 14, wherein the arbiter circuit is logically configured to ensure that a lowest voltage that the P-driver transistor can perceive during tri-state is the input/output supply voltage.

17. A voltage tolerant input/output circuit as recited in claim 14, wherein the voltage at a gate of the P-driver transistor is always high which blocks any DC leakage from an input/output voltage terminal to an input/output supply voltage terminal.

* * * * *